United States Patent [19]
Kane

[11] Patent Number: 5,256,888
[45] Date of Patent: Oct. 26, 1993

[54] TRANSISTOR DEVICE APPARATUS EMPLOYING FREE-SPACE ELECTRON EMISSION FROM A DIAMOND MATERIAL SURFACE

[75] Inventor: Robert C. Kane, Scottsdale, Ariz.

[73] Assignee: Motorola, Inc., Schaumburg, Ill.

[21] Appl. No.: 878,270

[22] Filed: May 4, 1992

[51] Int. Cl.[5] .................. H01L 29/72; H01L 27/02
[52] U.S. Cl. ......................... 257/77; 257/213; 257/565; 257/10; 313/499; 313/309; 313/346 R
[58] Field of Search ............ 257/10, 77, 213, 358, 257/565, 587; 313/499, 309, 346 R, 446

[56] References Cited

U.S. PATENT DOCUMENTS

| 5,075,595 | 12/1991 | Kane | 313/309 |
| 5,079,476 | 1/1992 | Kane | 313/309 |
| 5,141,460 | 8/1992 | Jaskie et al. | 313/309 |
| 5,180,951 | 1/1993 | Dworsky et al. | 313/346 R |
| 5,202,571 | 4/1993 | Hirabayashi et al. | 257/77 |

Primary Examiner—Rolf Hille
Assistant Examiner—Minhloan Tran
Attorney, Agent, or Firm—Eugene A. Parsons

[57] ABSTRACT

An electron device (100, 110, 200, 300, 400, 500) comprised of a semiconductor transistor such as a bipolar or field effect transistor, a diamond material layer (107, 206, 305), and a distally disposed anode is provided.

18 Claims, 4 Drawing Sheets

TRANSISTOR DEVICE APPARATUS EMPLOYING FREE-SPACE ELECTRON EMISSION FROM A DIAMOND MATERIAL SURFACE

FIELD OF THE INVENTION

This invention relates, in general, to electron devices, and more particularly, to electron devices employing diamond material electron emitters.

BACKGROUND OF THE INVENTION

Semiconductor electron devices such as bipolar and field effect transistors are commonly employed in the art. However, both bipolar and field effect transistors suffer from poor performance because of poor isolation and reverse voltage breakdown.

Diamond material electron devices such as those described in co-pending application entitled "ELECTRON DEVICE EMPLOYING A DIAMOND FILM ELECTRON SOURCE", Ser. No. 07/877,931, filed on May 04, 1992, may be improved by providing a means of integrating an active transistor control to a diamond material electron device.

Accordingly, there exists a need for an electron device which overcomes at least some of the shortcomings of the prior art.

SUMMARY OF THE INVENTION

These performance needs and others are substantially met by providing an electron device which includes a supporting substrate having a major surface and a transistor disposed in the supporting substrate substantially located in the major surface. The transistor includes a transistor collector, a transistor base, and a transistor emitter. A transistor base conductor is operably coupled to the transistor base, and a transistor emitter conductor is operably coupled to the transistor emitter. A diamond material layer having an electron emission surface that emits electrons is disposed on the major surface of the supporting substrate, as well as being operably coupled to the transistor collector. An anode is distally disposed with respect to the diamond material layer.

These performance needs and others are also met through provision of an electron device which includes a supporting substrate having a major surface and a transistor disposed in the supporting substrate substantially at the major surface. The transistor includes a transistor source, a transistor drain, and a transistor gate depletion region. A transistor source conductor is operably coupled to the transistor source, and a transistor gate conductor is operably coupled to the transistor gate depletion region. A diamond material layer having an electron emission surface that emits electrons is disposed on the major surface of the supporting substrate, as well as being operably coupled to the transistor drain. An anode is distally disposed with respect to the diamond material layer.

This need and others are further met through provision of an electron device including a supporting substrate having a major surface and a transistor disposed in the supporting substrate substantially at the major surface. The transistor includes a transistor source, a transistor drain, and a transistor gate region. A transistor source conductor is operably coupled to the transistor source. An insulator layer is disposed on a part of the major surface of the supporting substrate corresponding to the transistor gate region, and a transistor gate conductor is disposed on the insulator layer. A diamond material layer, having an electron emission surface that emits electrons is disposed on the major surface of the supporting substrate, and is operably coupled to the transistor drain. An anode is distally disposed with respect to the diamond material layer.

In some preferred embodiments of the present invention the anode, distally disposed with respect to the diamond material layer and defining a free space region therebetween provides for realization of an improved isolation and improved breakdown performance device.

In some embodiments of the present invention, electron emission from an electron emitting surface of the diamond material layer is substantially controlled by a transistor operably coupled to the diamond material layer.

DETAILED DESCRIPTION OF THE DRAWINGS

Figure 1:
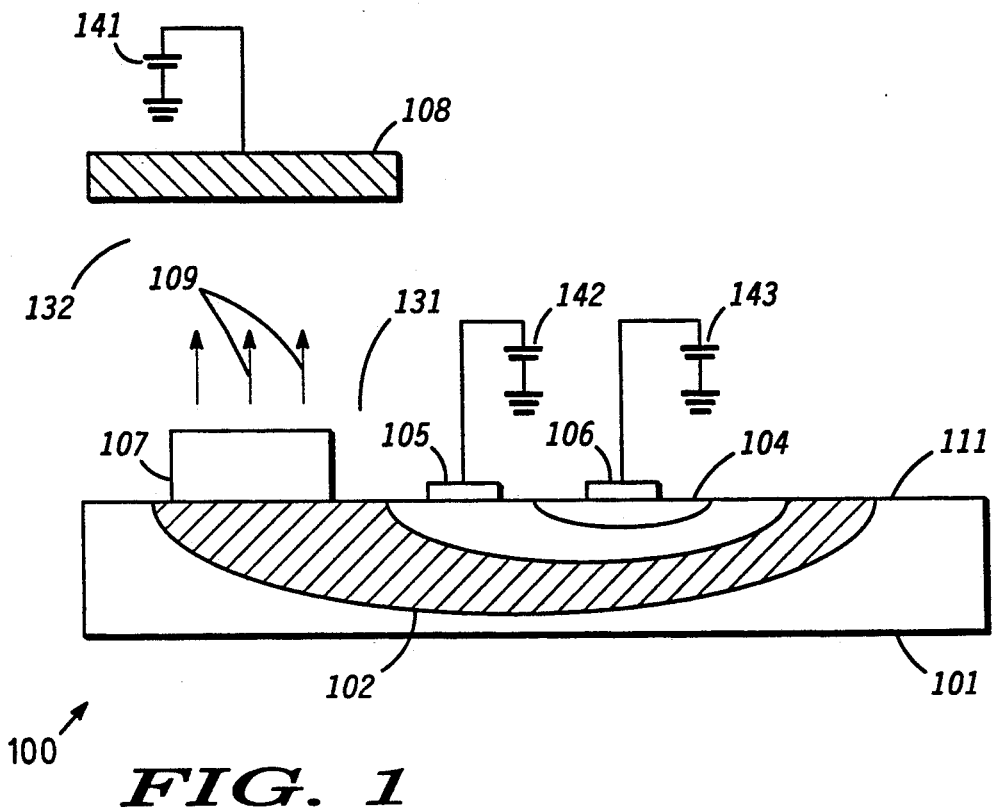
FIG. 1 is a cross-sectional view representing an embodiment of an electron device in accordance with the present invention.

FIG. 1 is a cross-sectional view representing an electron device 100 made in accordance with the present invention. A supporting substrate 101 having a major surface 111 is provided with a bipolar transistor disposed at major surface 111 of supporting substrate 101 and extending into supporting substrate 101. The bipolar transistor includes a transistor collector 102, a transistor base 103, and a transistor emitter 104. A transistor base conductor 105 is disposed on a part of major surface 111 corresponding to and operably coupled to transistor base 103. A transistor emitter conductor 106 is disposed on a part of major surface 111 corresponding to and operably coupled to transistor emitter 104. A diamond material layer, having at least an electron emission surface 131 for emitting electrons, is disposed on a part of major surface 111 corresponding to and operably coupled to transistor collector 102. An anode 108 is distally disposed with respect to electron emission surface 131, thus defining a free space region 132 therebetween.

Electron device 100 is advantageously employed by applying external signal sources such as voltage sources to at least some device elements 102, 103, and 104, as well as to some device conductors 105 and 106. For example, FIG. 1 illustrates that a voltage is applied between anode 108 and a reference potential, which is shown as a ground potential, by operably coupling a first external voltage source 141 between anode 108 and the ground or reference potential. Another voltage is shown applied between transistor base conductor 105 and ground or reference potential by operably coupling a second external voltage source 142 between transistor gate conductor 105 and the ground or reference potential. Additionally, another voltage is shown being applied between transistor emitter conductor 106 and the ground or reference potential by operably coupling a third externally provided voltage source 143 between transistor emitter conductor 106 and the ground or reference potential. It is anticipated that variations to the above may be advantageously employed wherein some of the described externally provided voltage sources may be omitted and the appropriate device element or conductor are operably coupled to the reference potential.

Electron device 100 shown in FIG. 1 and operably coupled to externally provided voltage sources as described previously operates in an ON mode when the voltages applied to transistor base conductor 105 and to transistor emitter conductor 106 forward bias the bipolar transistor base-emitter junction and by applying a suitable voltage at anode 108. Application of a voltage to anode 108 induces an electric field at electron emission surface 131 from which electrons, represented by arrows 109, are emitted into free space region 132 and some of the electrons are collected at anode 108. Electron device 100 is in an OFF mode when the voltage applied at anode 108 is insufficient to induce electron emission from electron emitting surface 131 of diamond material layer 107 or when the bipolar transistor base-emitter junction is reverse biased.

When in the OFF mode, as a result of reverse biasing the bipolar transistor base-emitter junction, electron device 100 is relatively insensitive to voltages or signals which may be applied to anode 108. Therefore, electron device 100 of the present invention does not suffer the reverse breakdown limitations and poor isolation characteristics of prior art semiconductor transistor devices.

Figure 2:
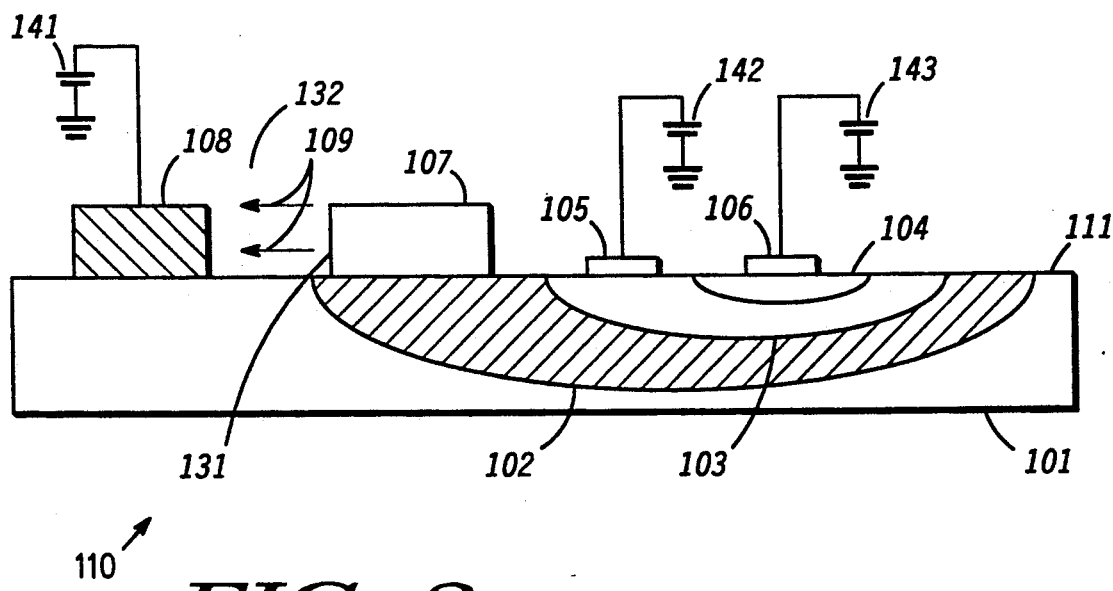
FIG. 2 is a cross-sectional view representing a modification of the embodiment in FIG. 1 of an electron device in accordance with the present invention.

FIG. 2 is a cross-sectional view representing a modification of the embodiment of FIG. 1 of an electron device 110 made in accordance with the present invention as previously described in FIG. 1, wherein anode 108 is disposed on a part of major surface 111 of supporting substrate 101 and distally disposed with respect to electron emitting surface 131 of diamond material layer 107, thereby defining free space region 132 therebetween. Operation of electron device 120 as described previously provides for electron emission, represented by arrows 109, from electron emission surface 131 into free space region 132 as shown in FIG. 2. It is desirable that at least some emitted electrons 109 are collected by anode 108.

Figure 3:
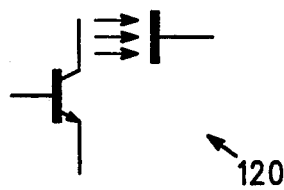
FIG. 3 is a schematic diagram representing the embodiments of both FIGS. 1 and 2.

FIG. 3 is a schematic diagram 120 that represents both electron devices 100 and 110 as previously described in FIGS. 1 and 2.

Figure 4:
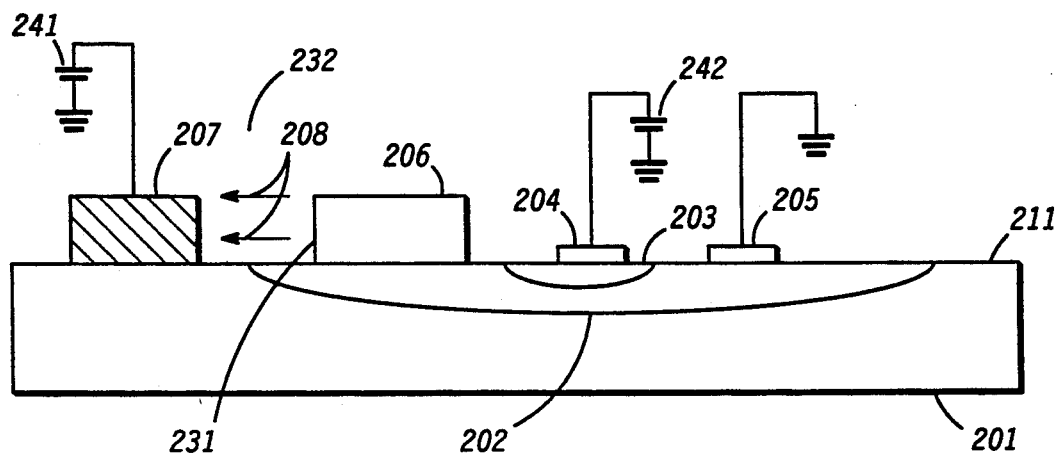
FIG. 4 is a cross-sectional view representing another embodiment of an electron device in accordance with the present invention.

FIG. 4 is a cross-sectional view representing another embodiment of an electron device 200 made in accordance with the present invention. A supporting substrate 201 having a major surface 211 is provided. A field effect transistor is disposed on major surface 211 of supporting substrate 201 and extending into supporting substrate 201 therefrom. The field effect transistor includes a transistor channel 202 and a transistor gate 203. A transistor gate conductor 204 is disposed on a part of major surface 211 corresponding to and operably coupled to transistor gate 203. A transistor source conductor 205 is disposed on a part of major surface 211 corresponding to and operably coupled to a part of transistor channel 202. A diamond material layer 206, having an electron emission surface 231 for emitting electrons is substantially disposed on a part of major surface 211 corresponding to and operably coupled to another part of channel 202. An anode 207 is disposed on a part of major surface 211 of supporting substrate 201 and distally located with respect to electron emission surface 231, thus defining a free space region 232 therebetween.

The field effect transistor may be operated and controlled, in either an ON mode or an OFF mode, by means of the magnitude and polarity of an applied voltage at transistor gate conductor 204. The applied voltage is provided by a second external voltage source 242. In the ON mode, the voltage applied to transistor gate conductor 204 allows for transistor gate or gate-channel junction depletion region 203 to be of such limited extent so as to maintain the transistor channel or channel 202 as continuous, thus providing a conduction path for electrons to diamond material layer 206. In the OFF mode, the voltage applied to transistor gate conductor 204 results in an extension of gate-channel junction across the channel 202 breadth, thereby effectively splitting channel 202 and preventing charge carrier flow or electron flow through the channel 202.

Application of a suitable voltage at anode 207 by means of a first externally provided voltage source 241 induces electrons, represented by arrows 208, to be emitted from electron emission surface 231 of diamond material layer 206 when the field effect transistor is in the ON mode.

As described previously in both electron devices 100 and 110 in FIGS. 1 and 2, electron device 200 of FIG. 4 is also relatively insensitive to voltages or signals which may be applied to anode 207 due to isolating characteristics of free space region 232.

Figure 5:
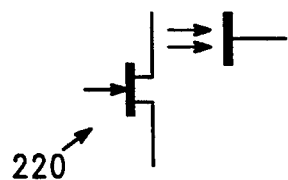
FIG. 5 is a schematic diagram representing the embodiment of the present invention as shown FIG. 4.

FIG. 5 is a schematic diagram 220 representing electron device 200 as described in FIG. 4.

Figure 6:
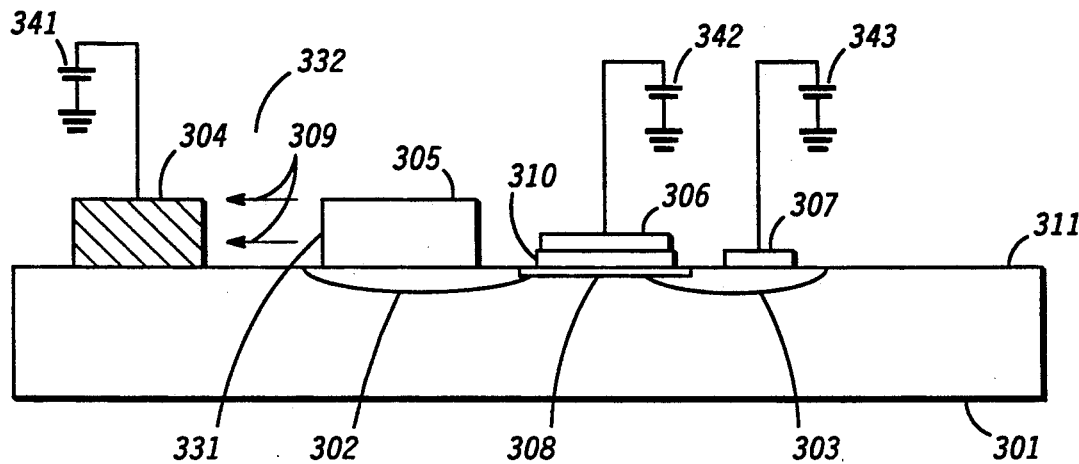
FIG. 6 is cross-sectional view representing yet another embodiment of an electron device in accordance with the present invention.

FIG. 6 is a cross-sectional view of yet another embodiment of an electron device 300 made in accordance with the present invention. A supporting substrate 301 having a major surface 311 is provided with a field effect transistor that is disposed at major surface 311 of supporting substrate 301 and extending into supporting substrate 301 therefrom. The field effect transistor includes a transistor drain 302, a transistor source 303, and a transistor gate region 308. An insulator layer 310 is disposed on a part of major surface 311 corresponding to transistor gate region 308. A transistor gate conductor 306 is disposed on insulator layer 310. A transistor source conductor 307 is disposed on a part of major surface 311 corresponding to and operably coupled to a part of transistor source 303. A diamond material layer 305, having an electron emission surface 331 for emitting electrons, represented by arrows 309, is disposed on a part of major surface 311 corresponding to and operably coupled to transistor drain 302. An anode 304 is disposed on a part of major surface 311 of supporting substrate 301 and distally located with respect to electron emission surface 331, thus defining a free space region 332 therebetween.

Operation of electron device 300 is effected by configuring external voltage sources to apply suitable voltages to any one or all conductors 306 and 307, and anode 304 of electron device 300 of FIG. 4. The field effect transistor is placed in the ON mode by applying a voltage/reference potential to transistor source conductor 307 and a voltage to transistor gate conductor 306. In this enhancement type field effect transistor, it is necessary to establish an inversion layer in transistor gate region 308 to provide a conduction path for electron transport to diamond material layer 305. Such a conductance path is provided by applying a suitable voltage or bias to transistor gate conductor 306, thus creating a population of charge carriers in transistor gate region 308 nearest transistor gate conductor 306 that is inverted from that of an unbiased condition.

Application of a suitable voltage at anode 304 by means of a first externally provided voltage source 341 induces electrons, represented by arrows 309, to be emitted from electron emission surface 331 of diamond material layer 305 when the field effect transistor is in the ON mode.

As with electron devices 100 and 110 previously described in FIGS. 1 and 2, electron device 300 of FIG. 6 is relatively insensitive to voltages or signals which are applied to anode 304 due to the isolating characteristic of free space region 332.

Figure 7:
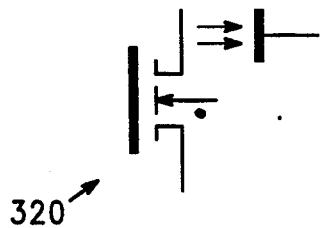
FIG. 7 is a schematic diagram representing the embodiment of the present invention shown in FIG. 6.

FIG. 7 is a schematic diagram 320 representing electron device 300 as described in FIG. 6.

Figure 8:
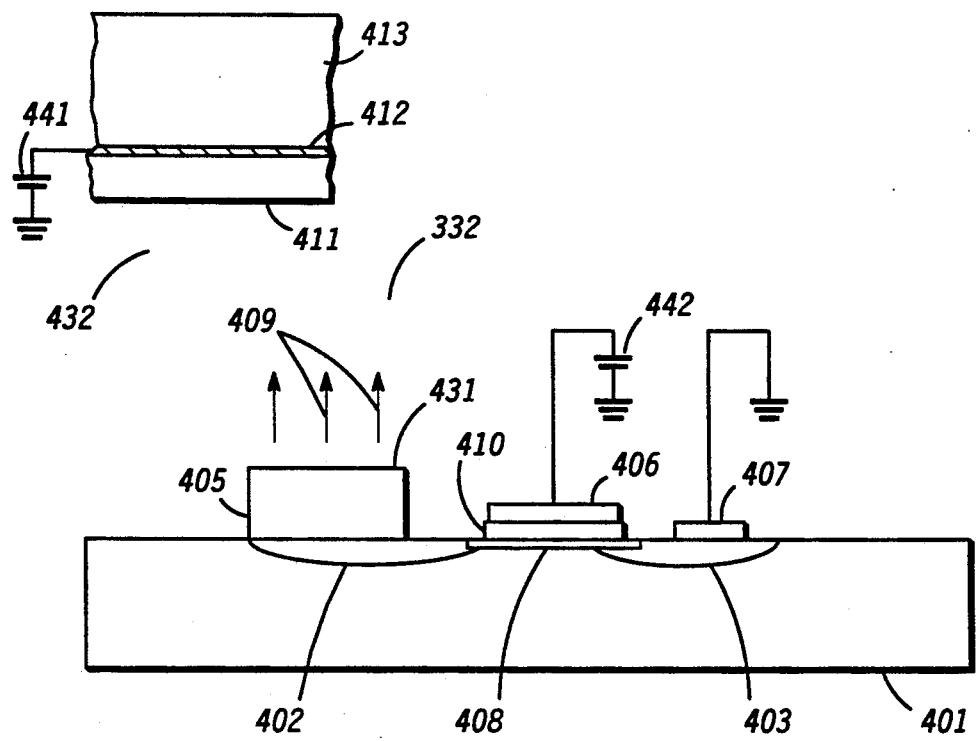
FIG. 8 is a cross-sectional view representing still another embodiment of an electron device in accordance with the present invention.

FIG. 8 is a cross-sectional view representing still another embodiment of an electron device 400 made in accordance with the present invention as previously described in FIG. 6. It should be understood that previously referenced features in FIG. 6 are similarly referenced beginning with the numeral "4". Electron device 400 represented in FIG. 8 includes an anode with a substantially optically transparent faceplate 413 on which is disposed a substantially optically transparent conductive layer 412 on which is disposed a luminescent layer 411. The anode is distally disposed with respect to electron emission surface 431 and defines a free space region 432 therebetween.

As constructed and when operated in the ON mode, electrons, represented by arrows 409, are emitted from electron emission surface 431 into free space region 432 some of which are collected at optically transparent conductive layer 412 of the anode. In the course of collecting electrons at the anode, some electrons transfer energy to luminescent layer 411 which induces photon radiation that may be observed by a viewer. By modulating the voltage applied to either or both transistor gate conductor 406 and transistor source conductor 407, it is possible to control the rate of electron emission, thereby controlling photon radiation from luminescent layer 411.

Figure 9:
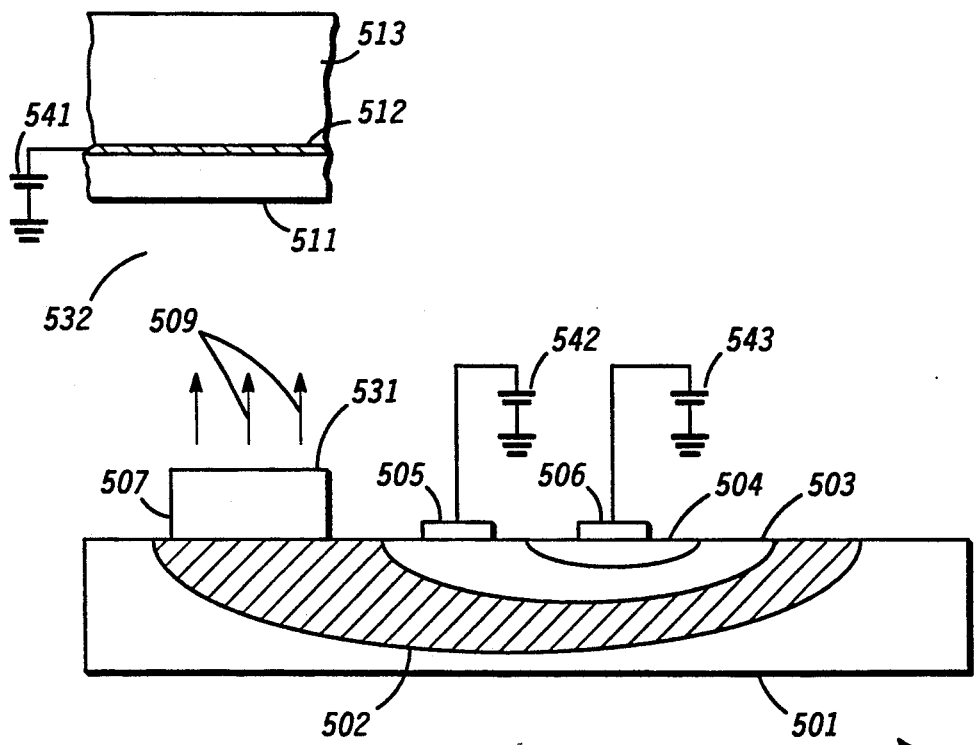
FIG. 9 is a cross-sectional view representing a further embodiment of an electron device in accordance with the present invention.

FIG. 9 is a cross-sectional view representing a further embodiment of an electron device 500 made in accordance with the present invention as previously described in FIG. 1. Additionally, it should be noted that features previously referenced in FIG. 1 are similarly referenced beginning with the numeral "5" in FIG. 9. Electron device 500 represented in FIG. 9 further includes an anode made with a substantially optically transparent faceplate 513 which is disposed on a substantially optically transparent conductive layer 512 on which is disposed on a luminescent layer 511. The anode is distally disposed with respect to electron emission surface 531, thus defining a free space region 532 therebetween.

As constructed and when operated in the ON mode, electrons, represented by arrows 509, are emitted from electron emission surface 531 into free space region 532 some of which are collected at substantially optically transparent conductive layer 512 of the anode. In the course of collecting electrons at the anode, some electron energy is transferred to luminescent layer 511 which induces photon radiation which may be observed by a viewer. By modulating the voltage applied to either or both transistor base conductor 505 and transistor emitter conductor 506, it is possible to control the rate of electron emission, thereby controlling photon radiation from luminescent layer 511.

One advantage of the present invention is to provide an electron device which does not suffer from the voltage breakdown limitations known to impede performance of prior art electron devices. This improvement is realized by providing an electron device which employs a free space region and a free space transport of electrons through a part of the electron device.

Another advantage of the present invention is to provide an electron device which does not suffer from the poor isolation characteristics of the prior art. This improvement is realized by providing an electron device which employs a free space region and free space transport of electrons through at least a part of the electron device.

Another advantage of the present invention is to provide an integrally controlled diamond material electron source which employs integrally formed transistor devices to control photon emission from a display screen.

I claim:

1. An electron device comprising:
   A a supporting substrate having a major surface;
   B a transistor disposed in the supporting substrate substantially at the major surface and comprised of at least a transistor collector, a transistor base; and a transistor emitter;
   C a transistor base conductor operably coupled to the transistor base;
   D a transistor emitter conductor operably coupled to the transistor emitter;
   E a diamond material layer, having an electron emitting surface for emission of electrons, disposed on the major surface of the supporting substrate and operably coupled to the transistor collector; and
   F an anode distally disposed with respect to the diamond material layer.

2. An electron device as claimed in claim 1 wherein the anode is disposed on the major surface of the supporting substrate.

3. An electron device as claimed claim 1 wherein the anode is comprised of:
   A a substantially optically transparent faceplate;
   B a substantially optically transparent conductive layer disposed on a part of the faceplate; and
   C a layer of luminescent material disposed on the conductive layer.

4. An electron device as claimed in claim 1 further including voltages applied between the transistor base and a reference potential, between the anode and the reference potential, and between the transistor emitter and the reference potential such that the transistor is placed in an ON mode to provide a source of electrons to be emitted from the electron emitting surface some of which are collected at the anode.

5. An electron device as claimed in claim 4 wherein the voltage applied between the transistor emitter and the reference potential is zero volts.

6. An electron device comprising:
A a supporting substrate having a major surface;
B a transistor disposed in the supporting substrate substantially at the major surface and including a transistor source, a transistor drain; and a transistor gate depletion region;
C a transistor source conductor operably coupled to the transistor source;
D a transistor gate conductor operably coupled to the transistor gate depletion region;
E a diamond material layer, having an electron emission surface for emitting electrons, disposed on the major surface of the supporting substrate and operably coupled to the transistor drain; and
F an anode distally disposed with respect to the diamond material layer.

7. An electron device as claimed in claim 6 wherein the anode is disposed on the major surface of the supporting substrate.

8. An electron device as claimed in claim 6 wherein the anode is comprised of:
A a substantially optically transparent faceplate;
B a substantially optically transparent conductive layer disposed on at least a part of the faceplate; and
C a layer of luminescent material disposed on the conductive layer.

9. An electron device as claimed in claim 6 further including voltages applied between the transistor gate conductor and a reference potential, between the anode and the reference potential, and between the transistor source and the reference potential such that the transistor is placed in an ON mode to provide a source of electrons to be emitted from the electron emitting surface some of which are collected at the anode.

10. An electron device as claimed in claim 9 wherein the voltage applied between the transistor source and the reference potential is zero volts.

11. An electron device comprised of:
A a supporting substrate having a major surface;
B a transistor disposed in the supporting substrate at the major surface and including a transistor source, a transistor drain; and a transistor gate region;
C a transistor source conductor operably coupled to the transistor source;
D an insulator layer disposed on a part of the major surface of the supporting substrate corresponding to the transistor gate region;
E a transistor gate conductor disposed on the insulator layer;
F a diamond material layer, having an electron emission surface for emitting electrons, disposed on the major surface of the supporting substrate and operably coupled to the transistor drain; and
G an anode distally disposed with respect to the diamond material layer.

12. An electron device as claimed in claim 11 wherein the anode is disposed on the major surface of the supporting substrate.

13. The electron device of claim 11 wherein the anode is comprised of:
A a substantially optically transparent faceplate;
B a substantially optically transparent conductive layer disposed on at least a part of the faceplate; and
C a layer of luminescent material disposed on the conductive layer.

14. The electron device of claim 11 and having at least voltages applied between the transistor gate conductor and a reference potential, between the anode and the reference potential, and between the transistor source and the reference potential such that the transistor is placed in an ON mode to provide a source of electrons to be emitted from the electron emitting surface some of which are collected at the anode.

15. The electron device of claim 14 wherein the voltage applied between the transistor source and the reference potential is zero volts.

16. An electron device comprising:
A a transistor including a transistor collector, a transistor base; and a transistor emitter;
B a transistor base conductor operably coupled to the transistor base;
C a transistor emitter conductor operably coupled to the transistor emitter;
D a diamond material layer, having an electron emission surface for emitting electrons, operably coupled to the transistor collector; and
E an anode distally disposed with respect to the diamond material layer.

17. An electron device comprising:
A a transistor including a transistor source, a transistor drain; and a transistor gate depletion region;
B a transistor source conductor operably coupled to the transistor source;
C a transistor gate conductor operably coupled to the transistor gate depletion region;
D a diamond material layer, having an electron emission surface for emitting electrons, operably coupled to the transistor drain; and
E an anode distally disposed with respect to the diamond material layer.

18. An electron device comprising:
A a transistor including a transistor source, a transistor drain; and a transistor gate region;
B a transistor source conductor operably coupled to the transistor source;
C an insulator layer disposed on the transistor gate region;
D a transistor gate conductor disposed on the insulator layer;
E a diamond material layer, having an electron emission surface for emitting electrons, operably coupled to the transistor drain; and
F an anode distally disposed with respect to the diamond material layer.

* * * * *